(12) United States Patent
Zhao et al.

(10) Patent No.: US 10,367,484 B2
(45) Date of Patent: Jul. 30, 2019

(54) RAMP BASED CLOCK SYNCHRONIZATION FOR STACKABLE CIRCUITS

(71) Applicant: TEXAS INSTRUMENTS INCORPORATED, Dallas, TX (US)

(72) Inventors: Mingyue Zhao, Cary, NC (US); Jiwei Fan, Cary, NC (US); Michael Munroe, Manchester, NH (US)

(73) Assignee: Texas Instruments Incorporated, Dallas, TX (US)

( * ) Notice: Subject to any disclaimer, the term of this patent is extended or adjusted under 35 U.S.C. 154(b) by 112 days.

(21) Appl. No.: 15/222,860

(22) Filed: Jul. 28, 2016

(65) Prior Publication Data

US 2018/0034450 A1    Feb. 1, 2018

(51) Int. Cl.
| | | |
|---|---|---|
| *H03K 4/48* | (2006.01) | |
| *H03L 7/00* | (2006.01) | |
| *H02M 3/158* | (2006.01) | |
| *H03K 4/502* | (2006.01) | |
| *H03K 3/3562* | (2006.01) | |

(52) U.S. Cl.
CPC ............ *H03K 4/48* (2013.01); *H02M 3/1584* (2013.01); *H03K 3/3562* (2013.01); *H03L 7/00* (2013.01); *H02M 2003/1586* (2013.01); *H03K 4/502* (2013.01)

(58) Field of Classification Search
CPC .......... H03K 4/48; H03K 3/353; H03K 3/356; H03K 3/3562; H03K 3/35625; H02M 3/02; H02M 3/04; H02M 3/10; H02M 3/145; H02M 3/155; H02M 3/156; H02M 3/158; H02M 3/1584; H03L 7/00; H03L 7/081; H03L 7/0812; H03L 7/0814; H03L 7/0816; H03L 7/0818
USPC ........ 327/141, 291, 524, 530, 534–541, 543
See application file for complete search history.

(56) References Cited

U.S. PATENT DOCUMENTS

| | | | | |
|---|---|---|---|---|
| 6,847,008 B2 * | 1/2005 | Myers | .................. | B23K 9/0253 219/130.51 |
| 7,075,346 B1 * | 7/2006 | Hariman | ............. | H02M 3/1584 327/116 |
| 8,564,259 B2 * | 10/2013 | Chen | .................... | H02M 3/1582 323/259 |

* cited by examiner

*Primary Examiner* — Lincoln D Donovan
*Assistant Examiner* — Diana J. Cheng
(74) *Attorney, Agent, or Firm* — Tuenlap Chan; Charles A. Brill; Frank D. Cimino

(57) ABSTRACT

A phase generation circuit is disclosed. The circuit includes a ramp generation circuit arranged to generate a ramp signal in synchronization with a synchronization clock signal. A phase selection circuit generates a reference signal in response to a phase selection signal. A comparator has a first input terminal coupled to receive the ramp signal and a second input terminal coupled to receive the reference signal. The comparator produces a phase clock signal at an output terminal.

15 Claims, 18 Drawing Sheets

| PHASE NUMBER | PHASE ANGLE | $V_{PH-REF}$ |
|---|---|---|
| TWO PHASE | PHASE 1 (0°)<br>PHASE 2 (180°) | SP0: 0 OF $V_{PEAK}$<br>SP3: 1/2 OF $V_{PEAK}$ |
| THREE PHASE | PHASE 1 (0°)<br>PHASE 2 (120°)<br>PHASE 3 (240°) | SP0: 0 OF $V_{PEAK}$<br>SP3: 1/3 OF $V_{PEAK}$<br>SP4: 2/3 OF $V_{PEAK}$ |
| FOUR PHASE | PHASE 1 (0°)<br>PHASE 2 (90°)<br>PHASE 3 (180°)<br>PHASE 4 (270°) | SP0: 0 OF $V_{PEAK}$<br>SP1: 1/4 OF $V_{PEAK}$<br>SP3: 1/2 OF $V_{PEAK}$<br>SP5: 3/4 OF $V_{PEAK}$ |

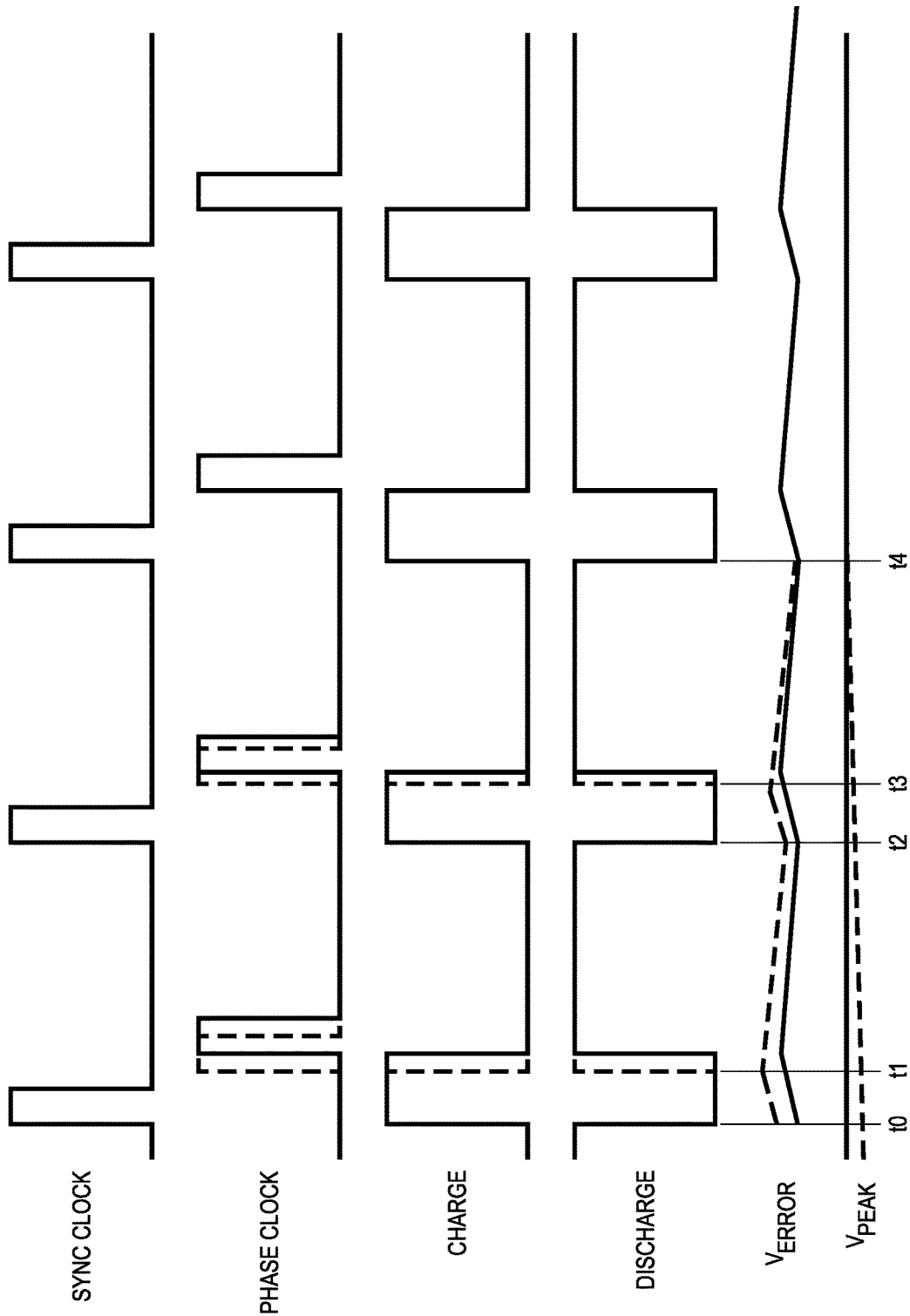

US 10,367,484 B2

RAMP BASED CLOCK SYNCHRONIZATION FOR STACKABLE CIRCUITS

BACKGROUND OF THE INVENTION

Embodiments of the present invention relate to ramp based clock synchronization for stackable power supply circuits.

Multiple phase stackable power supply circuits are used to generate relatively high currents for various applications such as computers, servers, communications systems, smart power systems, LED lighting systems, and various other applications. Each stackable power supply circuit may be an AC-to-DC or DC-to-DC converter such as a buck converter or buck boost converter. Each stackable power supply circuit is typically connected to a common input bus and a common output bus. They are normally configured as a Master and one or more Slave circuits, each having a respective phase and operating in synchronization with a synchronization clock signal. There are several problems associated with clock synchronization. Referring to FIGS. 1A and 1B, synchronization clocks 102 and 104 must run at a much higher frequency than their respective Master or Slave clocks. The synchronization clocks are frequency divided to produce the Master and Slave clocks in their proper phases. The high frequency synchronization increases system noise, power consumption, and complicates printed circuit board design.

A second problem is that each synchronization clock must include a marker to identify the beginning of each sequence of synchronization clock cycles. For example, FIG. 1A omits a pulse at position 100 to indicate the beginning of a sequence of clock cycles. For a two phase system, the Master clock is then generated at the missing pulse and the Slave clock is generated at the fourth synchronization clock pulse after the missing pulse. The synchronization clock of FIG. 1B uses a relatively higher pulse voltage at position 106 to indicate the beginning of a sequence of clock cycles. Master and Slave clocks then derive their respective phase with reference to pulse 106. This, however, complicates Master, Slave, and synchronization clock design.

In view of the foregoing problems, embodiments of the present invention are directed to generating simplified and more flexible Master and Slave clocks suitable for stackable power supply circuits.

BRIEF SUMMARY OF THE INVENTION

In a preferred embodiment of the present invention, a phase generation circuit is disclosed. The circuit includes a ramp generation circuit arranged to generate a ramp signal in synchronization with a synchronization clock signal. A phase selection circuit generates a reference signal in response to a phase selection signal. A comparator has a first input terminal coupled to receive the ramp signal and a second input terminal coupled to receive the reference signal. The comparator produces a phase clock signal at an output terminal.

BRIEF DESCRIPTION OF THE SEVERAL VIEWS OF THE DRAWING

FIG. 10B is a timing diagram showing operation of the phase error correction circuit of FIG. 10A;

DETAILED DESCRIPTION OF THE INVENTION

The preferred embodiments of the present invention provide significant advantages over phase shifted clock synchronization circuits of the prior art as will become evident from the following detailed description.

Figure 2A:
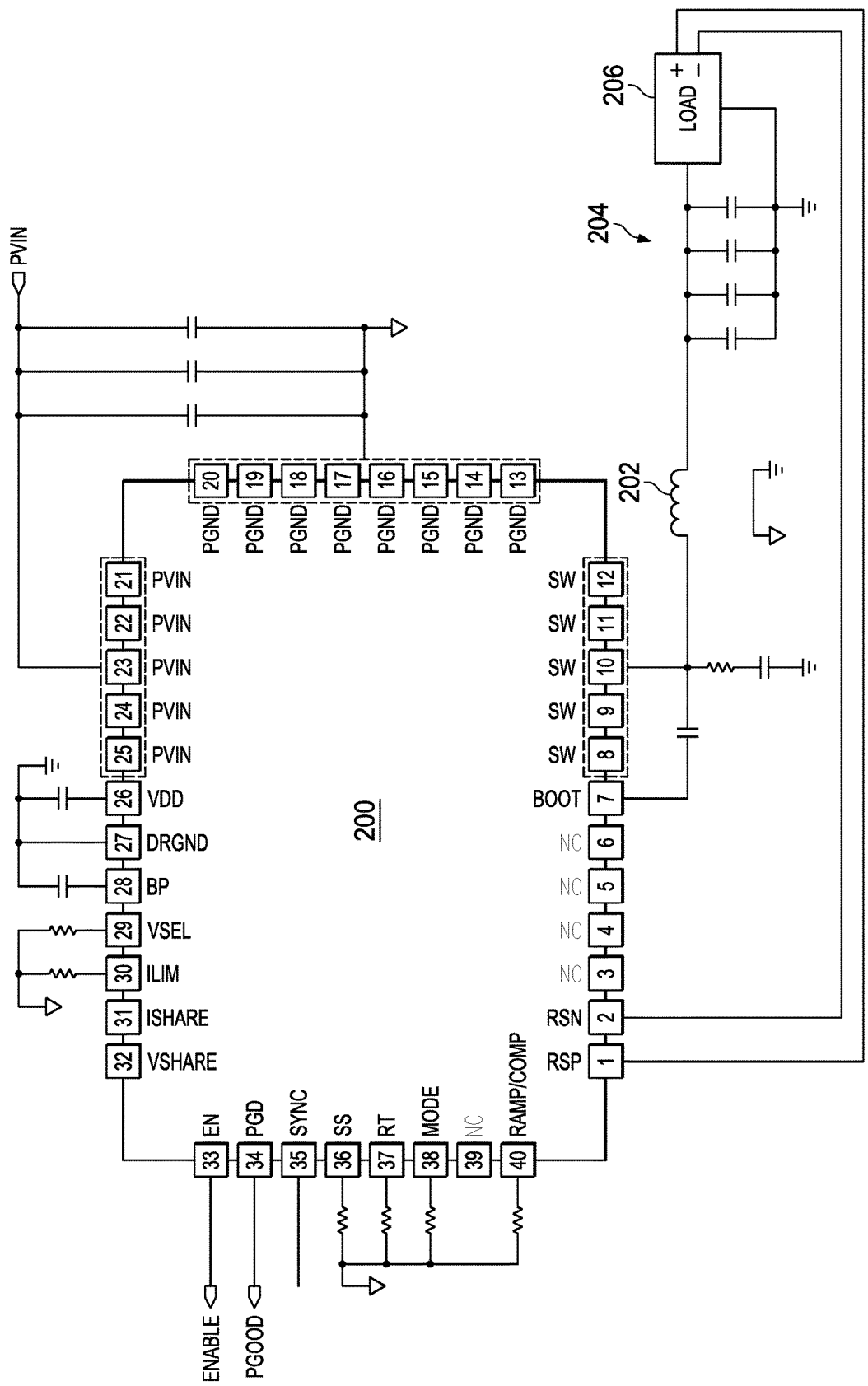
FIG. 2A is a schematic diagram of a single phase stackable synchronous buck converter.

Referring to FIG. 2A, there is a schematic diagram of a single phase stackable synchronous buck converter. The buck converter is a highly efficient DC-to-DC converter that uses pulse width modulation (PWM) to provide current to load 206 at a predetermined supply voltage. The buck converter includes control circuit 200, load inductor 202, and filter capacitor array 204. Load circuit 206 is connected in parallel with filter capacitor array 204. A sample of the load voltage is applied to positive remote sense amplifier terminal RSP and negative remote sense amplifier terminal RSN. A power voltage input (PVIN) is applied across PVIN terminals and power ground (PGND) terminals. Both PVIN and PGND may include multiple terminals of control circuit 200 to distribute current. Switch terminals SW of control circuit 200 are directly connected to load inductor 202 to provide load current as determined by PWM switching circuits.

Figure 2B:
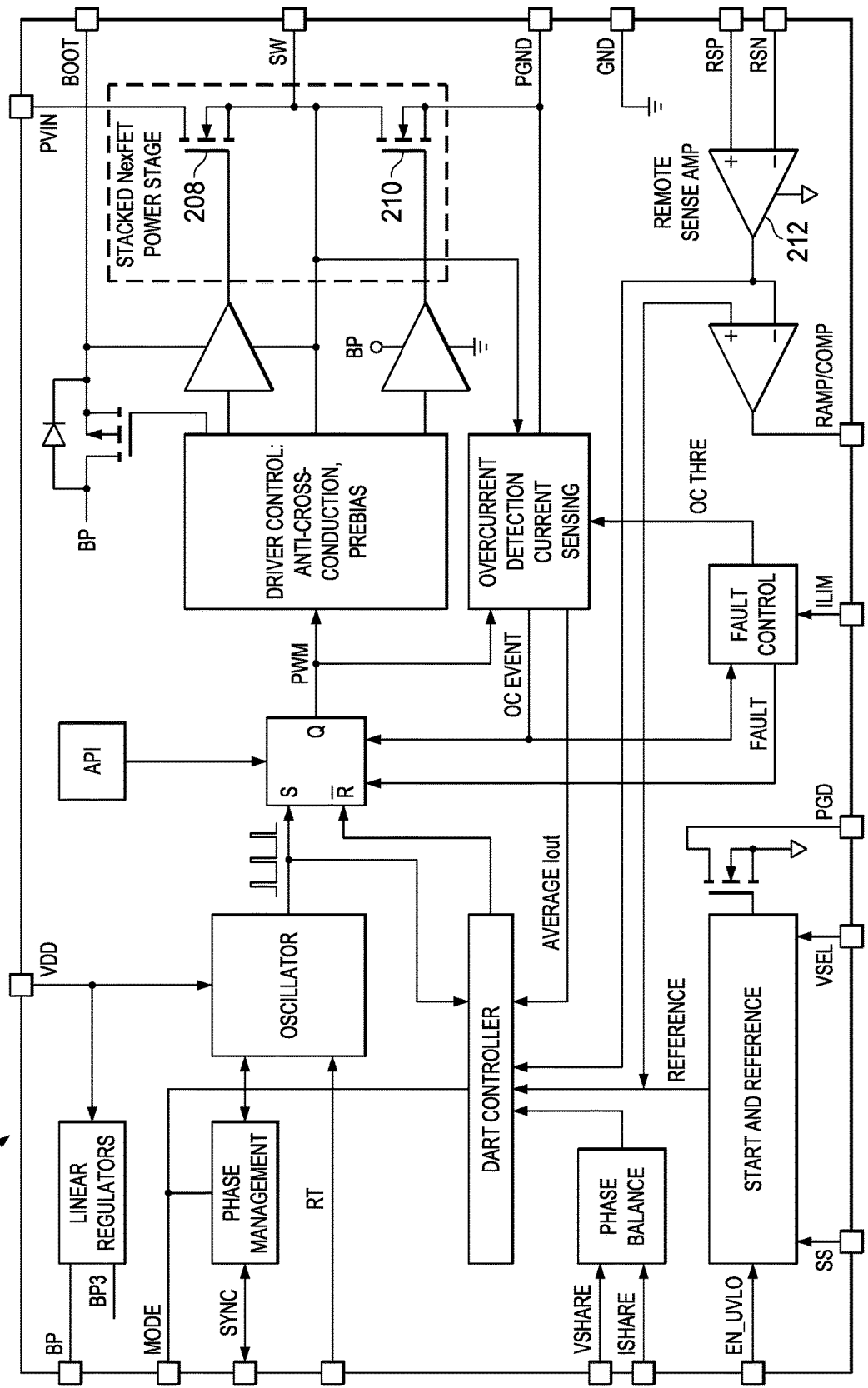
FIG. 2B is a schematic diagram of control circuit 200 of FIG. 2A.

FIG. 2B is a detailed block diagram of control circuit 200. Terminals VDD and GND are power supply terminals for the control circuit. Terminal BP is a supply voltage terminal connected to an on board regulator and is used to power the driver stage. Terminal BOOT receives a bootstrap signal to boost the high side driver connected to n-channel transistor 208. Terminal VSEL is connected to GND by a resistor to select an internal reference voltage. Terminal SS is connected to GND by a resistor to select a soft start time. Terminal RT is connected to GND by a resistor to select a switching frequency and to select a synchronization point in stackable applications. Terminal MODE is connected to GND by a resistor to select an operational mode in stackable applications. Terminal RAMP/COMP is connected to GND by a resistor to select a ramp signal level. Terminal SYNC is arranged to receive or produce a synchronization signal in stackable applications. Terminals VSHARE and ISHARE receive respective voltage and current sharing signals for multi-phase operation in stackable applications. Terminal ILIM is connected to GND by a resistor to select a current limit level. EN_UVLO is an enable terminal that is arranged to turn on control circuit 200 with hysteresis to program VDD under voltage lockout.

In operation, control circuit 200 provides high side current from PVIN through n-channel transistor 208 and inductor 202 to load 206 for a time determined by signal PWM. The duration of PWM provides current to load 206 to maintain a desired load voltage as determined by remote sense amplifier 212. After n-channel transistor 208 turns off, n-channel transistor 210 turns off to provide current through inductor 202. N-channel transistors 208 and 210, therefore, alternately conduct current through inductor 202 to load 206 to maintain a predetermined load voltage. For multi-phase operation in stackable applications, Master and Slave operation is determined by the phase management circuit as will be explained in detail.

Figures 3, 6B:
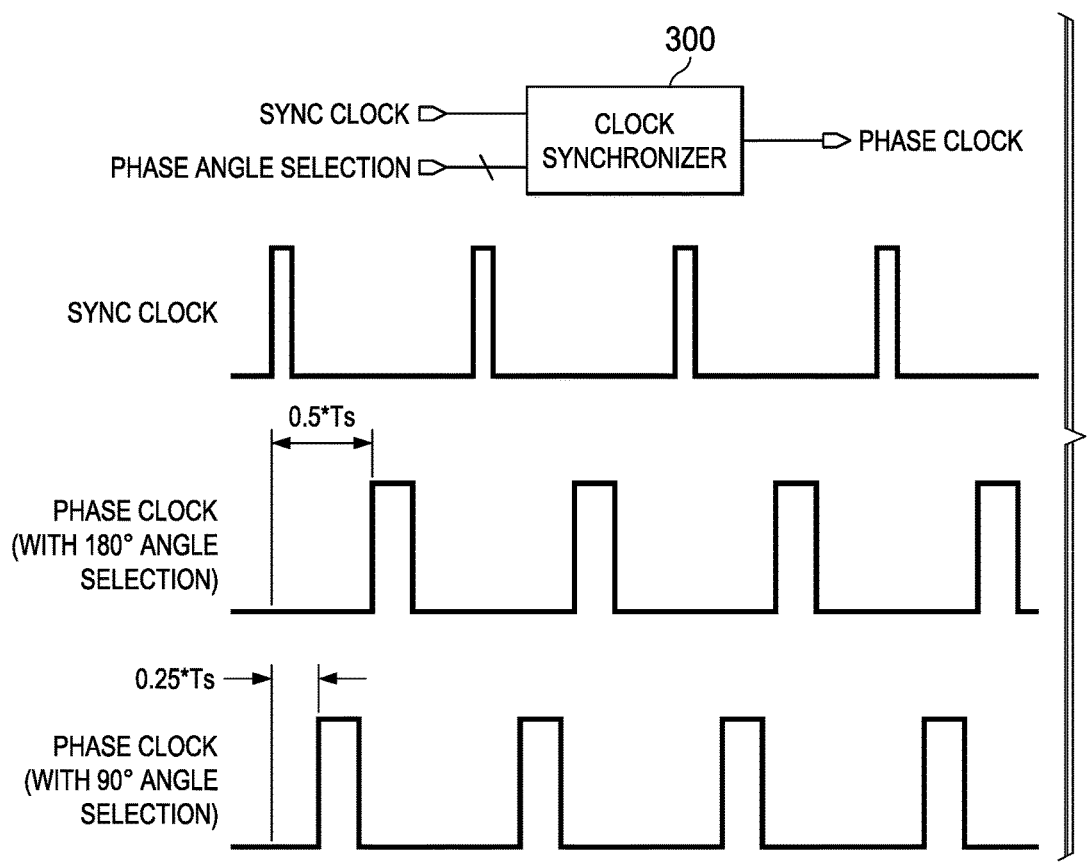
FIG. 3 illustrates phase clock generation from a synchronization (SYNC) clock for 180 degree or 90 degree phase selection.
FIG. 6B is a diagram showing appropriate phase reference levels for two, three, and four phase clock signal generation.

The Phase Management circuit (FIG. 2B) includes a clock synchronizer circuit 300 as shown at FIG. 3. The clock synchronizer circuit receives a SYNC clock signal and a phase angle selection signal. In a stackable multi-phase application, the SYNC clock typically activates the Master control circuit. The phase clocks operate in synchronization with the SYNC clock to activate respective Slave control circuits. For example, with a SYNC clock having a period of Ts, the Master control circuit is activated by the leading edge of the SYNC clock. If a two phase clock is selected by the phase angle selection signal, a single phase clock is generated and delayed with respect to the SYNC clock by 0.5 Ts. The Slave control circuit is activated by the leading edge of the single phase clock. Alternatively, if a four phase clock is selected by the phase angle selection signal, a first of three phase clocks is generated and delayed with respect to the SYNC clock by 0.25 Ts. A second of three phase clocks is generated and delayed with respect to the SYNC clock by 0.5 Ts. A second Slave control circuit is activated by the leading edge of the second phase clock. A third of three phase clocks is generated and delayed with respect to the SYNC clock by 0.75 Ts. A third Slave control circuit is activated by the leading edge of the third phase clock. Next, the SYNC clock activates the Master control circuit at time Ts, and the four phases are repeated.

Figure 4:
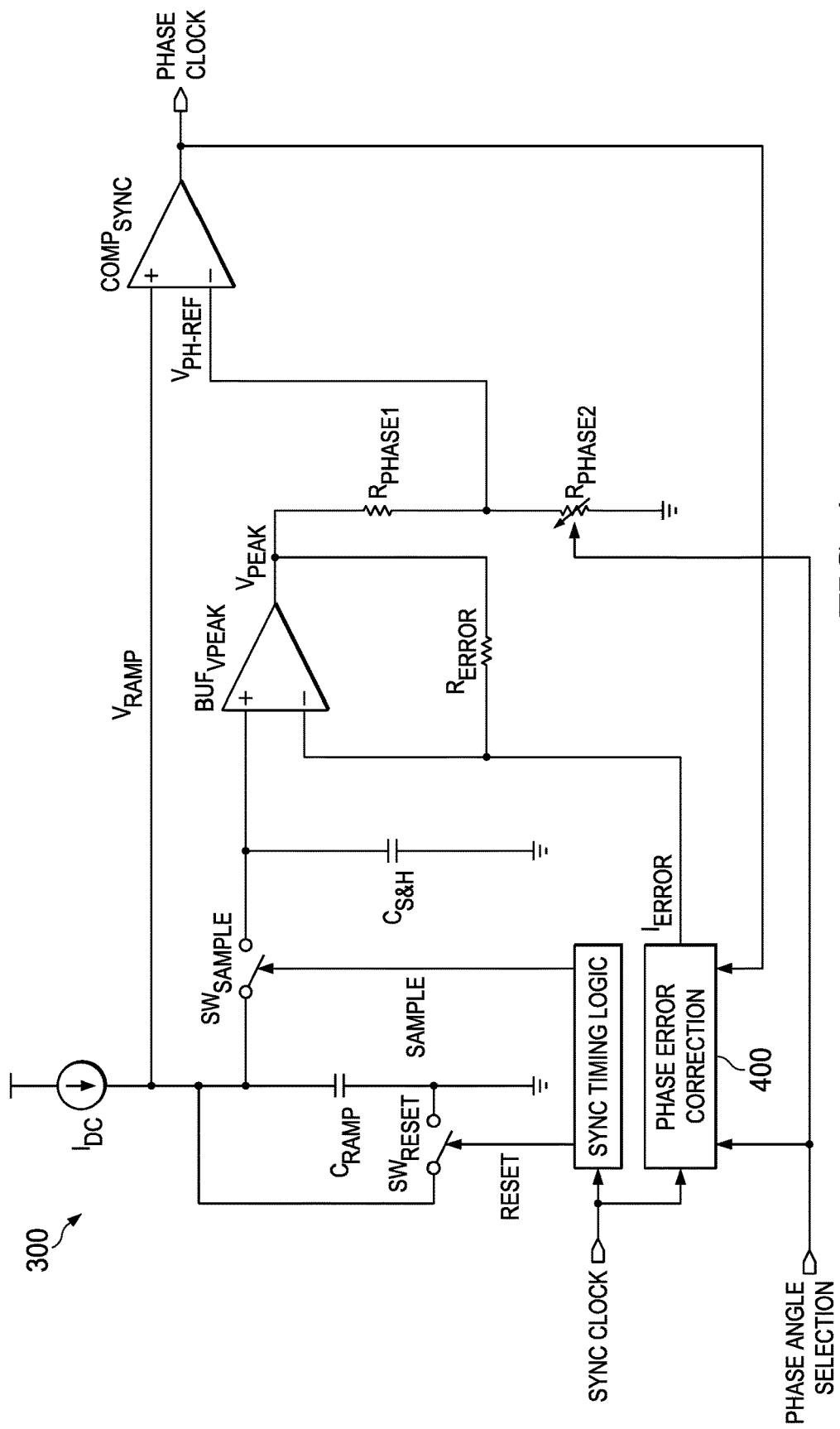
FIG. 4 is a schematic diagram of clock synchronizer 300 of FIG. 3.

Turning now to FIG. 4, there is a schematic diagram of clock synchronizer circuit 300. The clock synchronizer circuit includes a SYNC timing circuit and a phase error correction circuit 400. A ramp generator circuit formed by current source $I_{DC}$ and capacitor $C_{RAMP}$ is arranged to produce a ramp signal at the positive input terminal of comparator $COMP_{SYNC}$. A phase angle selection signal is applied to phase error correction circuit 400 as well as programmable resistor $R_{PHASE2}$. Programmable resistor $R_{PHASE2}$ forms a voltage divider with resistor $R_{PHASE1}$. Together they divide voltage $V_{PEAK}$ to produce reference voltage $V_{PH-REF}$. Reference voltage $V_{PH-REF}$ is applied to the negative terminal of comparator $COMP_{SYNC}$. Comparator $COMP_{SYNC}$ is arranged to produce a phase clock signal for a respective Slave control circuit. The PHASE CLOCK signal is also fed back to phase error correction circuit 400 to produce error current $I_{ERROR}$ to correct ramp peak voltage $V_{PEAK}$.

Figure 5:
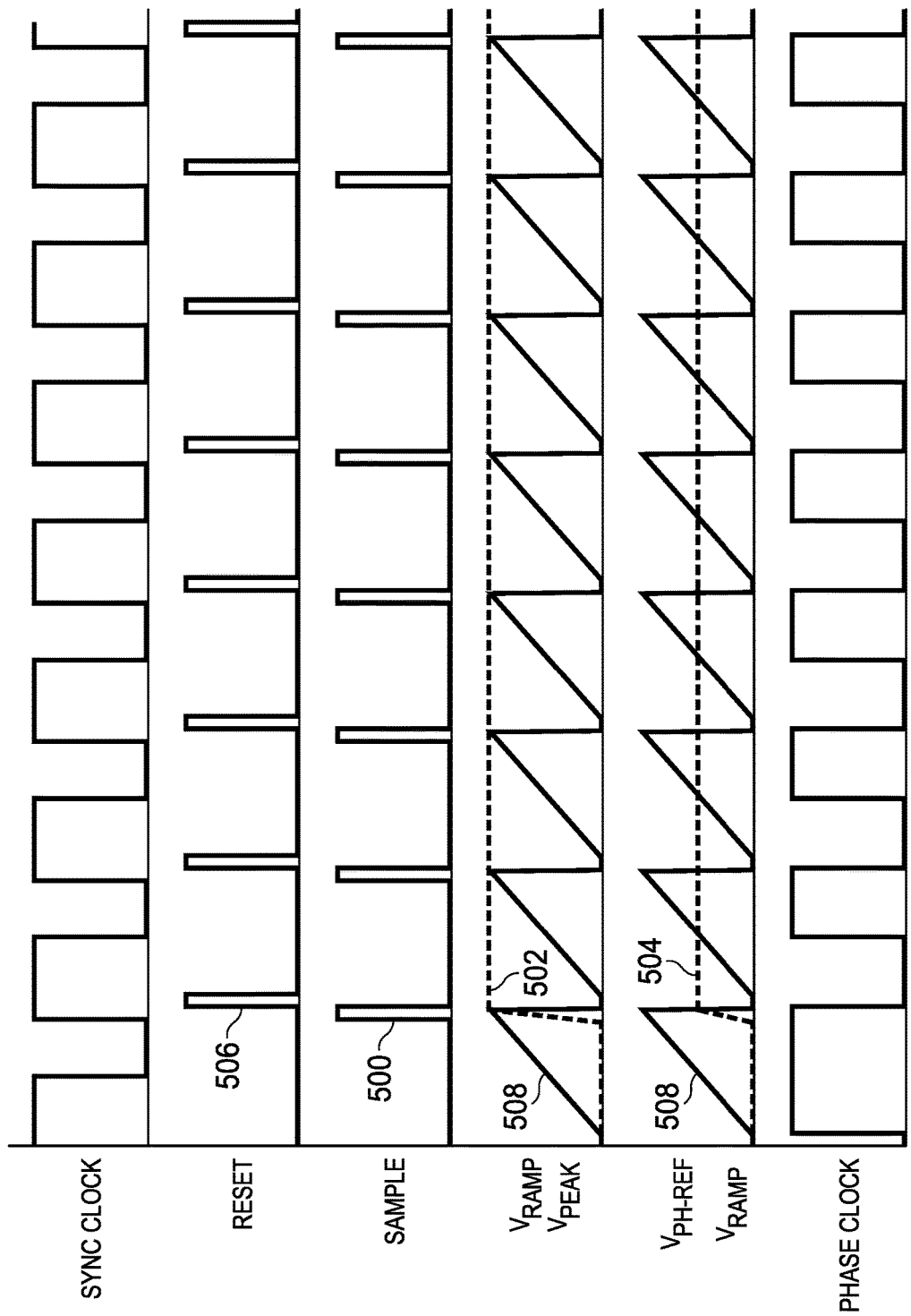
FIG. 5 is a timing diagram showing waveforms of the clock synchronizer circuit of FIG. 4.

Operation of the clock synchronizer circuit will now be explained with reference to the timing diagram of FIG. 5. SAMPLE signal 500 initially activates switch $SW_{SAMPLE}$ to store a peak value of ramp voltage $V_{RAMP}$ on sample and hold capacitor $C_{S\&H}$. The sample voltage is applied to the positive input terminal of buffer comparator $BUF_{VPEAK}$. The positive sample voltage causes output $V_{PEAK}$ to increase to a maximum value 502. At the same time, $V_{PH-REF}$ 504 increases to a value determined by the voltage divider formed by resistors $R_{PHASE1}$ and $R_{PHASE2}$. SAMPLE signal 500 then goes low to turn off switch $SW_{SAMPLE}$ and store the sample voltage on capacitor $C_{S\&H}$. RESET signal 506 then goes high to activate switch $SW_{RESET}$ to discharge capacitor $C_{RAMP}$. RESET signal 506 then returns low to deactivate switch $SW_{RESET}$. Current source $I_{DC}$ then charges capacitor $C_{RAMP}$ to produce ramp signal $V_{RAMP}$ 508. When ramp signal $V_{RAMP}$ is greater than reference signal $V_{PH-REF}$, PHASE CLOCK goes high to activate a respective Slave control circuit. The preceding sequence continues with a new sample voltage for each cycle of SYNC clock followed by a new $V_{RAMP}$ in response to each RESET signal pulse.

Figure 1A:
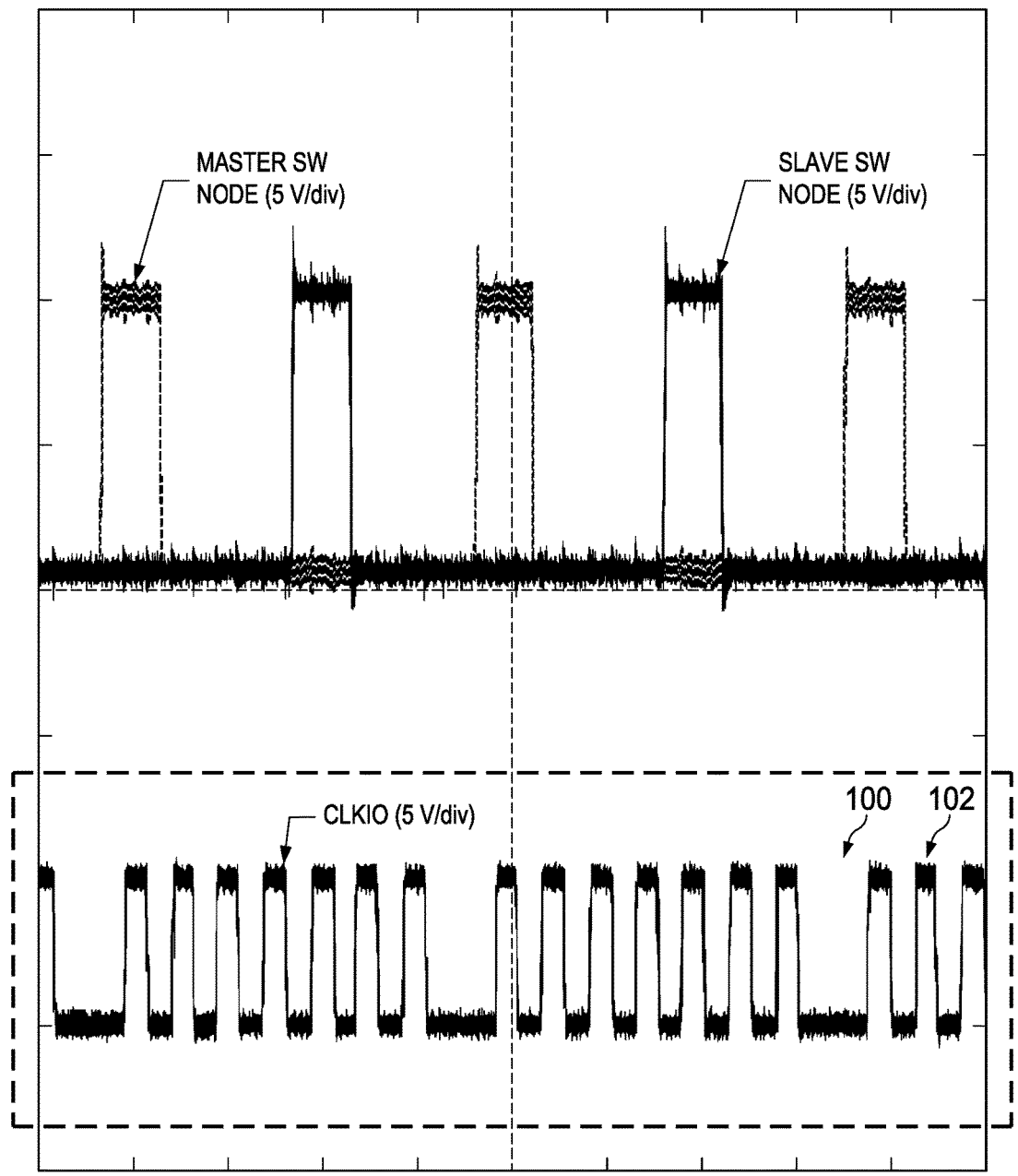
FIGS. 1A and 1B are waveforms of conventional Master, Slave, and synchronization clocks.
Figure 1B:
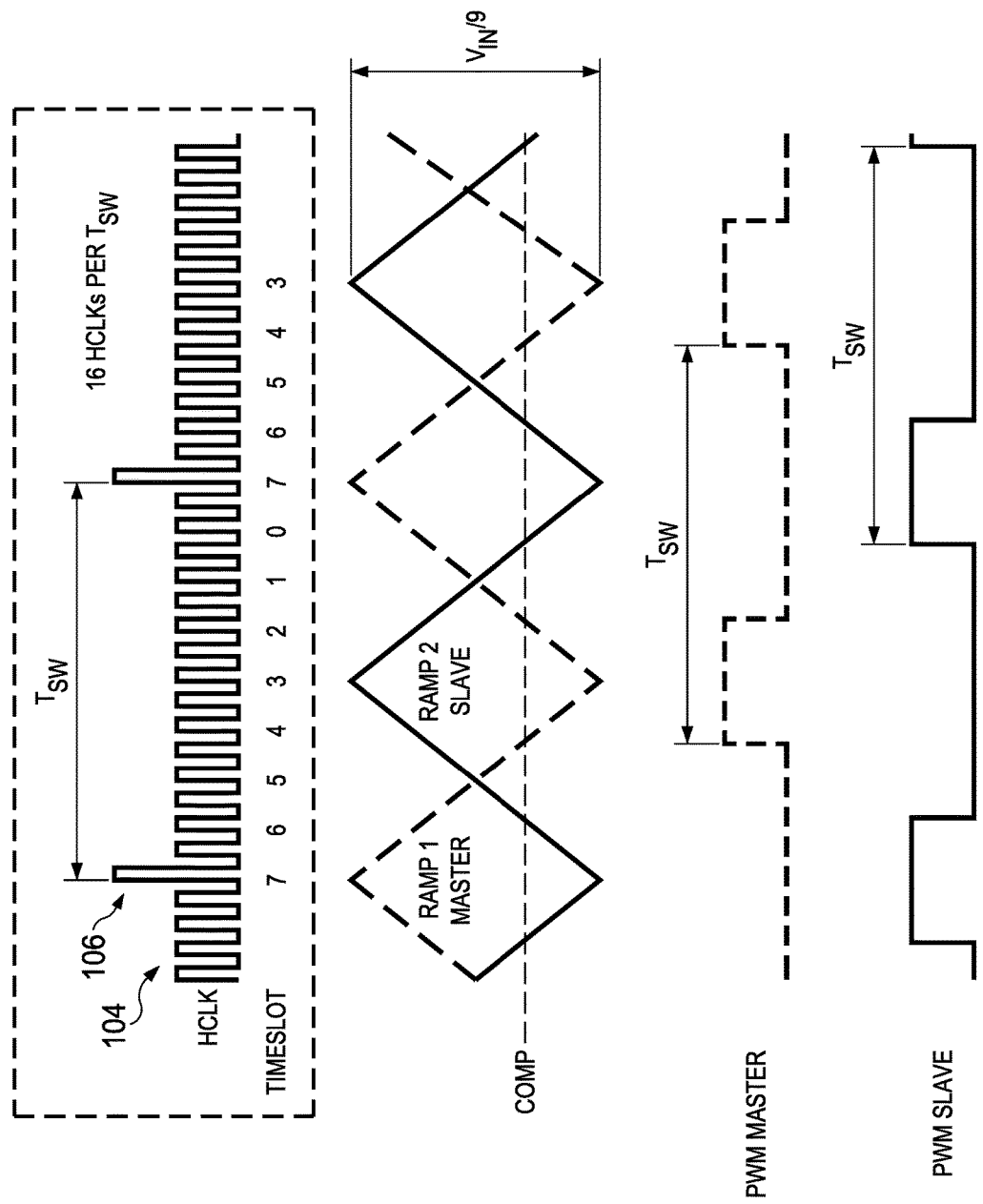

There are several advantages of the present invention for multi-phase buck converter operation. First, each ramp voltage $V_{RAMP}$ for each Slave control circuit is generated synchronously with respect to the SYNC clock. There is no requirement for a SYNC clock marker as in FIGS. 1A and 1B. Second, the frequency of each $V_{RAMP}$ signal is the same as the SYNC clock. There is no need to divide a high frequency clock to produce individual PHASE CLOCK signals. Third, the PHASE CLOCK signal of each Slave control circuit is programmable and determined by selection of reference voltage $V_{PH-REF}$. Finally, low frequency operation of the Master and Slave buck converters reduces power consumption and simplifies board design.

Figure 6A:
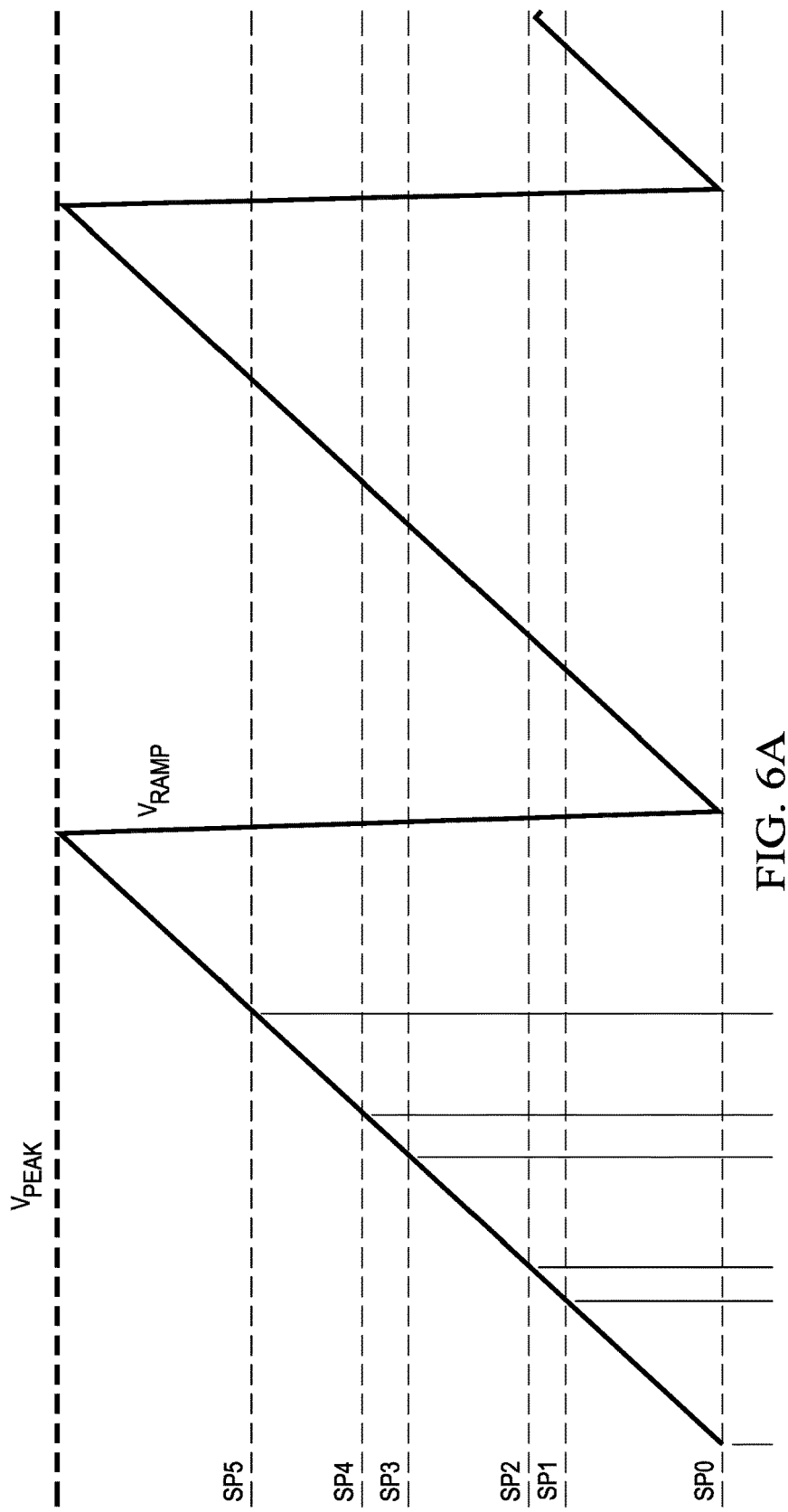
FIG. 6A is a diagram showing phase reference levels with respect to voltage $V_{RAMP}$.

Referring next to FIG. 6A, there is a diagram showing phase reference levels SP0 through SP5 with respect to peak voltage $V_{PEAK}$ of $V_{RAMP}$. FIG. 6B shows appropriate phase reference levels for two, three, and four phase clock signal generation. For two phase operation, the Master is activated at SP0 or the beginning of $V_{RAMP}$. This corresponds to the leading edge of SYNC clock. The phase two Slave is activated when $V_{RAMP}$ exceeds reference level SP3 or one half of $V_{PEAK}$. For three phase operation, the Master is again activated at SP0 or the beginning of $V_{RAMP}$. The phase two Slave is activated 120 degrees later when $V_{RAMP}$ exceeds reference level SP2 or one third of $V_{PEAK}$. The phase three Slave is activated 240 degrees after the Master when $V_{RAMP}$ exceeds reference level SP4 or two thirds of $V_{PEAK}$. For four phase operation, the Master is again activated at SP0 or the beginning of $V_{RAMP}$. The phase two Slave is activated 90 degrees later when $V_{RAMP}$ exceeds reference level SP1 or one fourth of $V_{PEAK}$. The phase three Slave is activated 180 degrees after the Master when $V_{RAMP}$ exceeds reference level SP3 or one half of $V_{PEAK}$. Finally, the phase four Slave is activated 270 degrees after the Master when $V_{RAMP}$ exceeds reference level SP5 or three fourths of $V_{PEAK}$.

Figure 7A:
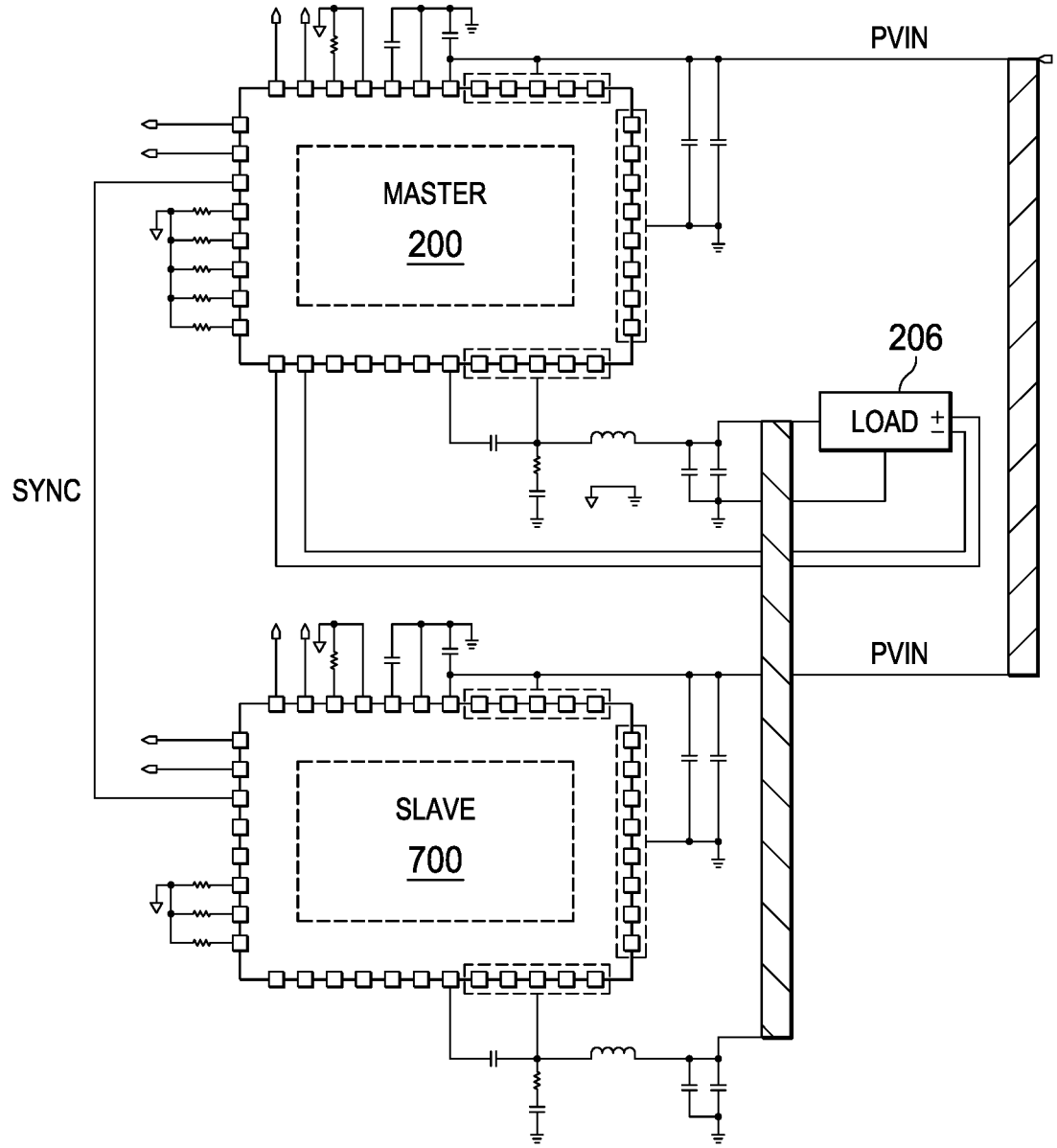
FIG. 7A is a schematic diagram of an embodiment of the present invention with two phase clock generation.
Figure 7B:
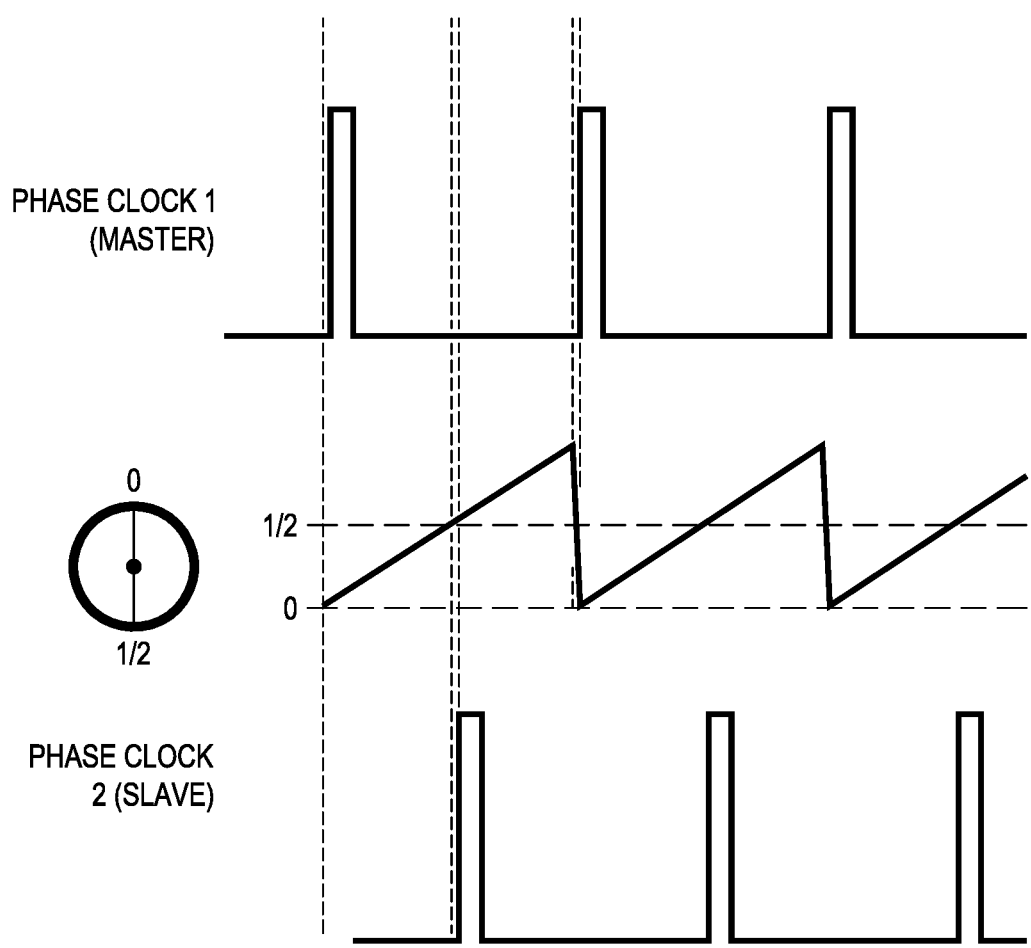
FIG. 7B is a simplified timing diagram showing operation of the circuit of FIG. 7A.

FIG. 7A is a schematic diagram of an embodiment of the present invention with two phase clock generation. FIG. 7B is a simplified timing diagram showing operation of the circuit of FIG. 7A. Master control circuit 200 operates a first buck converter as previously described to receive input voltage PVIN and supply current to the load circuit. It is activated by phase clock 1 corresponding to SYNC at the beginning of $V_{RAMP}$. Slave control circuit 700 operates a second buck converter to receive input voltage PVIN and supply current to the load circuit. It is activated by phase clock 2 when $V_{RAMP}$ exceeds a reference voltage equal to one half of the peak voltage of $V_{RAMP}$.

Figure 8A:
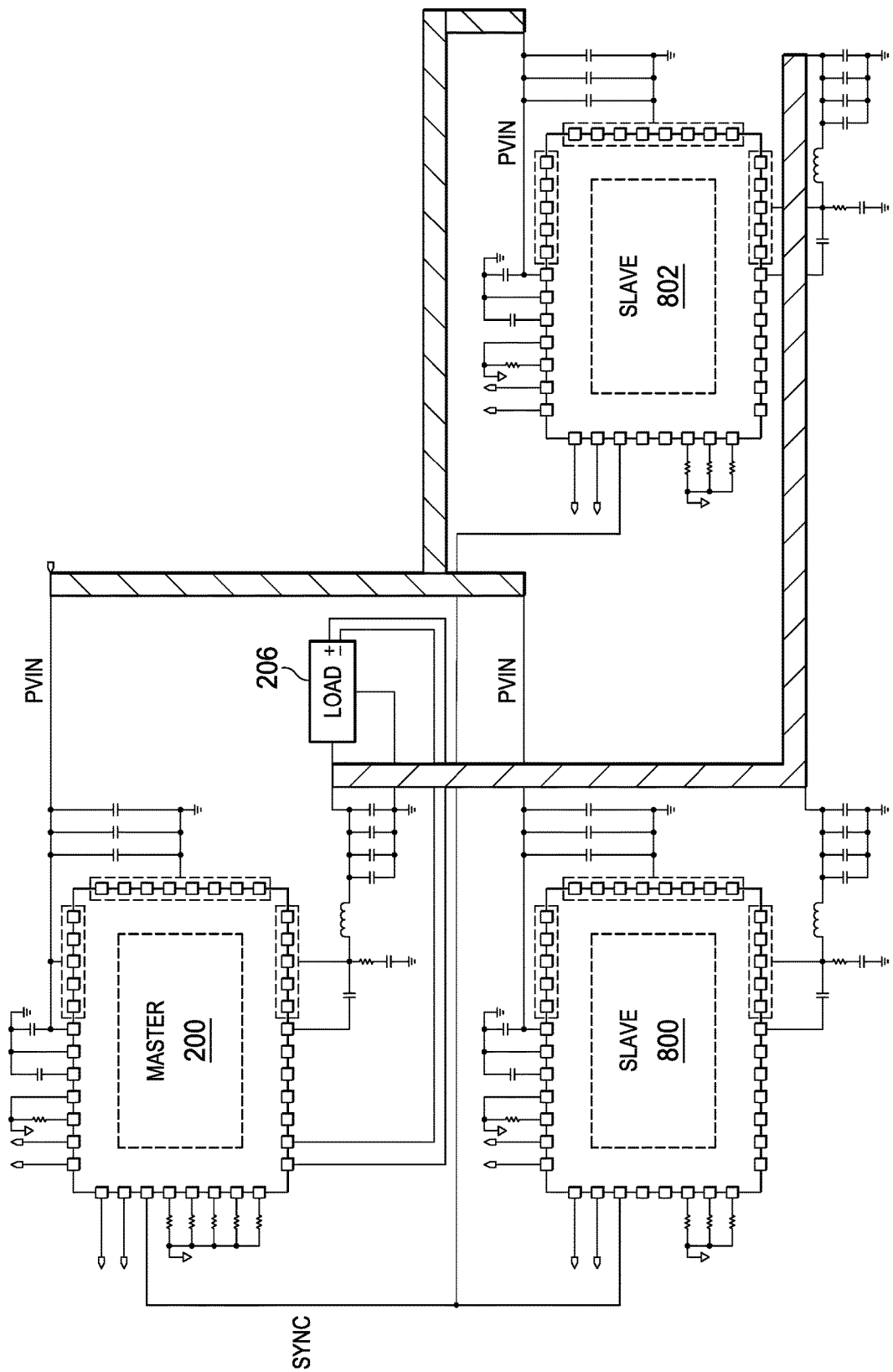
FIG. 8A is a schematic diagram of an embodiment of the present invention with three phase clock generation.
Figure 8B:
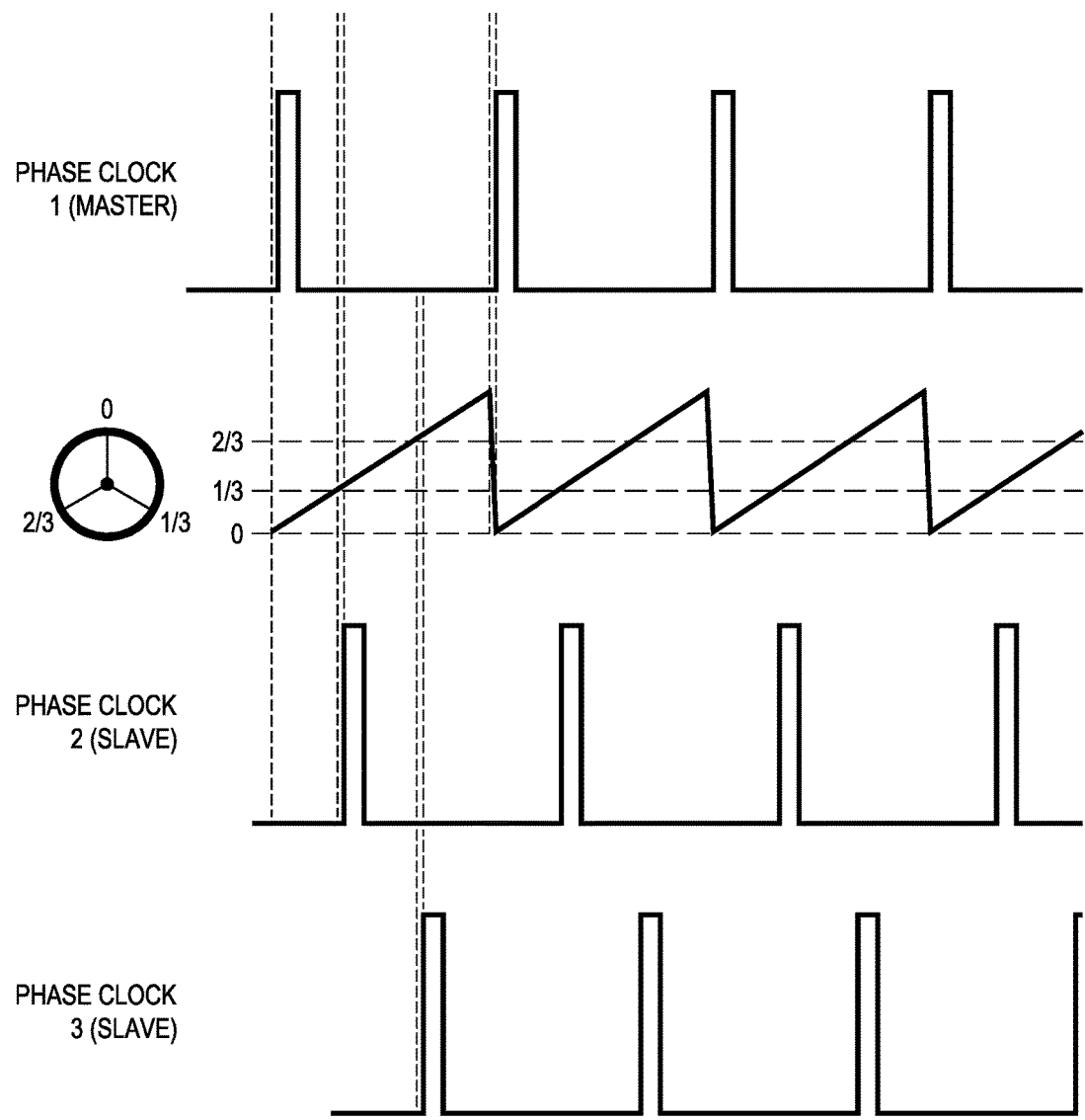
FIG. 8B is a simplified timing diagram showing operation of the circuit of FIG. 8A.

FIG. 8A is a schematic diagram of an embodiment of the present invention with three phase clock generation. FIG. 8B is a simplified timing diagram showing operation of the circuit of FIG. 8A. Master control circuit 200 operates a first buck converter to receive input voltage PVIN and supply current to the load circuit. It is activated by phase clock 1 corresponding to SYNC at the beginning of $V_{RAMP}$. Slave control circuit 800 operates a second buck converter to receive input voltage PVIN and supply current to the load circuit. It is activated by phase clock 2 when $V_{RAMP}$ exceeds a reference voltage equal to one third of the peak voltage of $V_{RAMP}$. Slave control circuit 802 operates a third buck converter to receive input voltage PVIN and supply current to the load circuit. It is activated by phase clock 3 when $V_{RAMP}$ exceeds a reference voltage equal to two thirds of the peak voltage of $V_{RAMP}$.

Figure 9A:
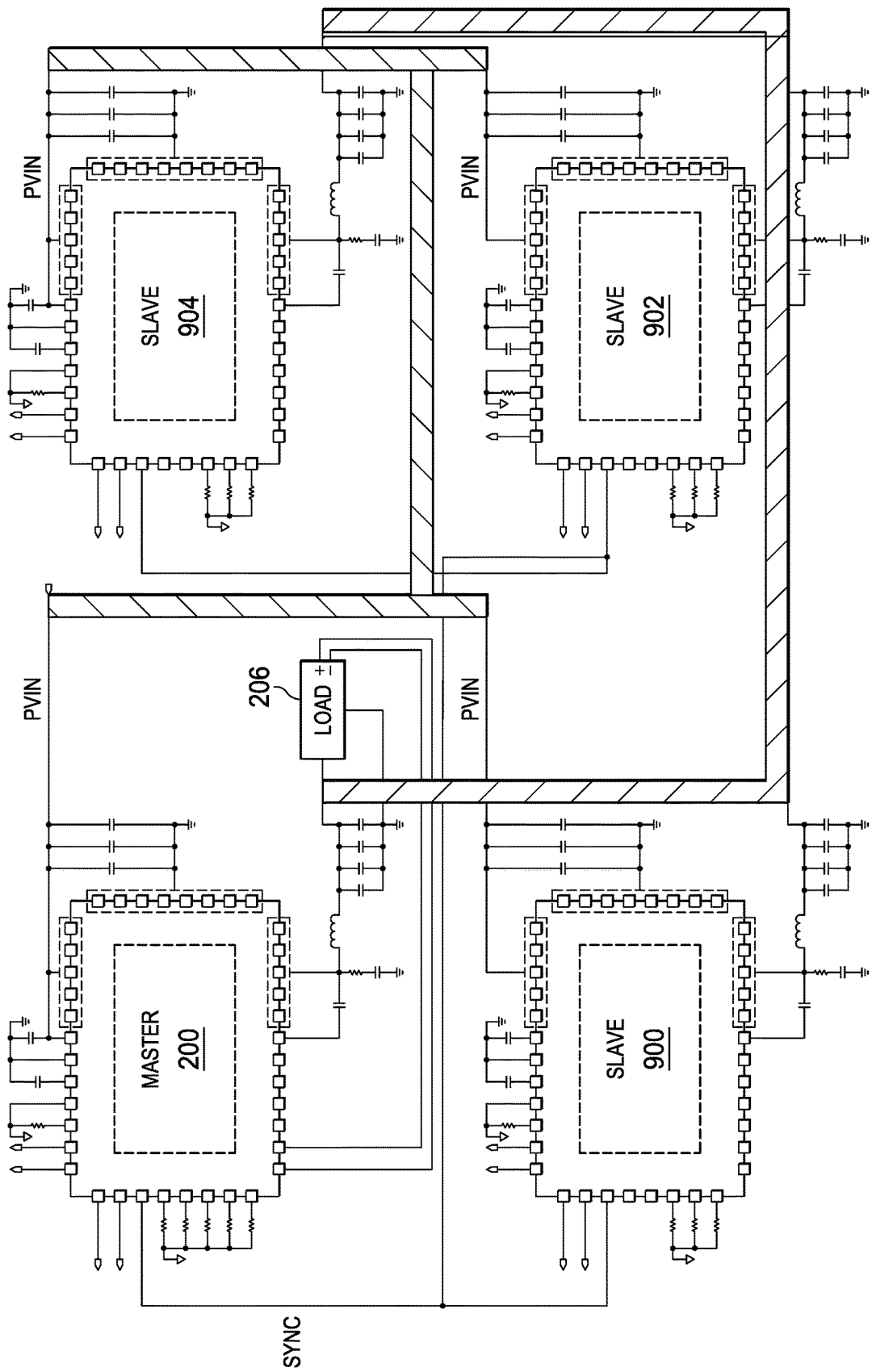
FIG. 9A is a schematic diagram of an embodiment of the present invention with four phase clock generation.
Figure 9B:
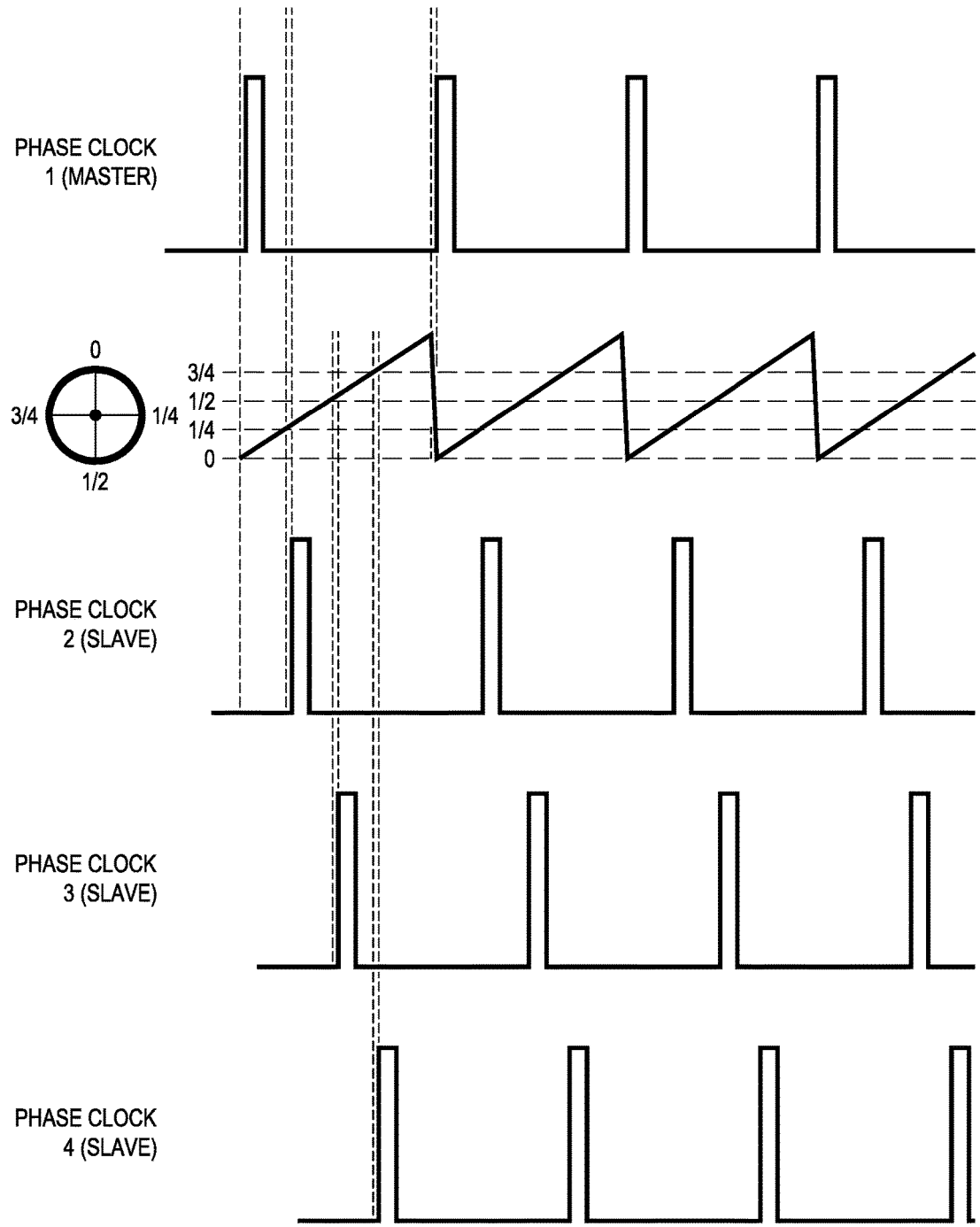
FIG. 9B is a simplified timing diagram showing operation of the circuit of FIG. 9A.

FIG. 9A is a schematic diagram of an embodiment of the present invention with four phase clock generation. FIG. 9B is a simplified timing diagram showing operation of the circuit of FIG. 9A. Master control circuit 200 operates a first buck converter to receive input voltage PVIN and supply current to the load circuit. It is activated by phase clock 1 corresponding to SYNC at the beginning of $V_{RAMP}$. Slave control circuit 900 operates a second buck converter to receive input voltage PVIN and supply current to the load circuit. It is activated by phase clock 2 when $V_{RAMP}$ exceeds a reference voltage equal to one fourth of the peak voltage of $V_{RAMP}$. Slave control circuit 902 operates a third buck converter to receive input voltage PVIN and supply current to the load circuit. It is activated by phase clock 3 when $V_{RAMP}$ exceeds a reference voltage equal to one half of the peak voltage of $V_{RAMP}$. Slave control circuit 904 operates a fourth buck converter to receive input voltage PVIN and supply current to the load circuit. It is activated by phase clock 4 when $V_{RAMP}$ exceeds a reference voltage equal to three fourths of the peak voltage of $V_{RAMP}$.

Figure 10A:
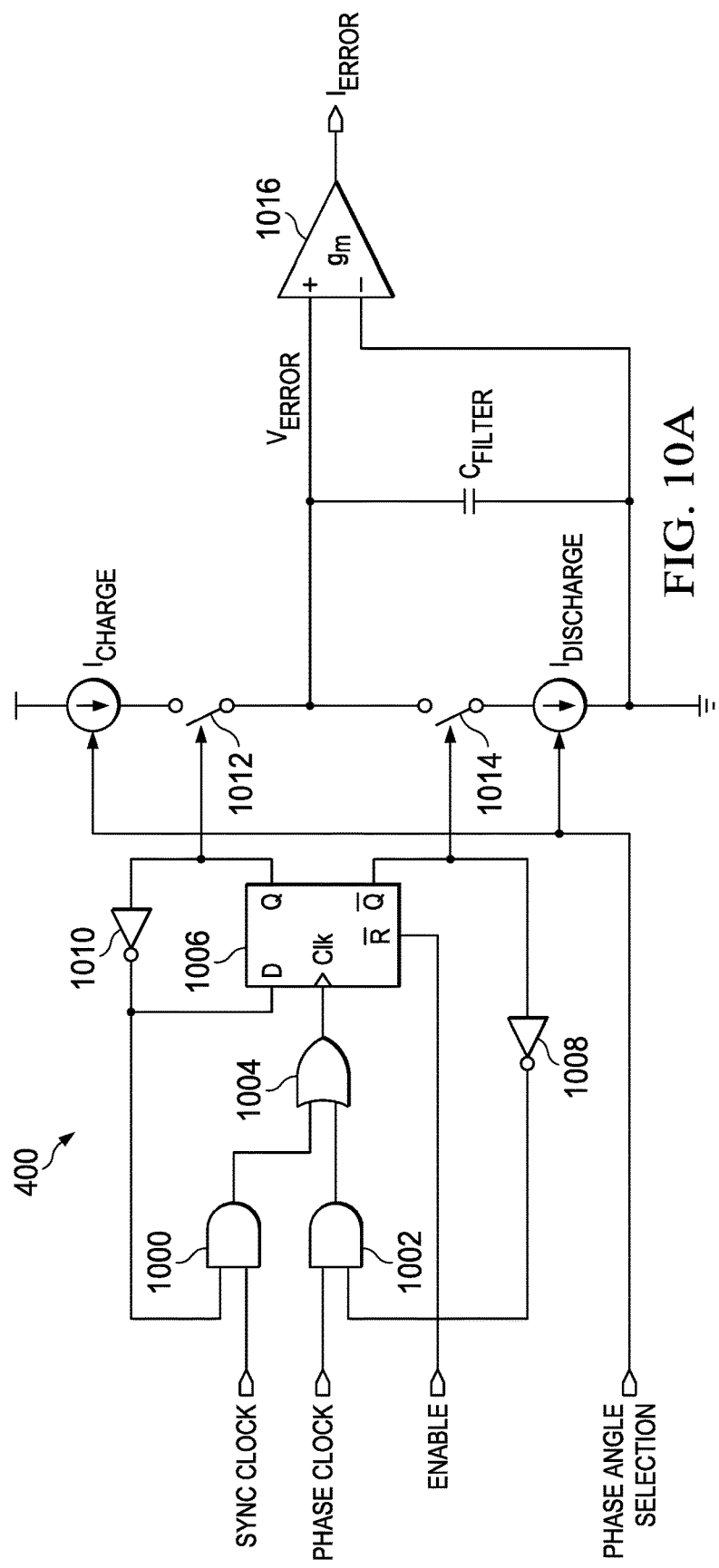
FIG. 10A is a schematic diagram of the phase error correction circuit of FIG. 4.

Referring now to FIG. 10A, there a schematic diagram of the phase error correction circuit 400 of FIG. 4. The phase error correction circuit compares the SYNC clock to the PHASE clock and applies error current $I_{ERROR}$ to buffer $BUF_{VPEAK}$ to adjust $V_{PEAK}$ and $V_{PH-REF}$ (FIG. 4), thereby correcting any phase error between Master and Slave control circuits of respective buck converters. Operation of the phase error correction circuit will be explained with reference to the timing diagram of FIG. 10B. The solid lines of FIG. 10B indicate circuit operation in equilibrium when there is no phase error. Here, equilibrium means the product of D and $I_{CHARGE}$ is equal to the product of (1–D) and $I_{DISCHARGE}$, where D is the duty cycle of the CHARGE signal. For example, if PHASE clock of FIG. 10B is 90 degrees after SYNC clock, equilibrium is achieved when 0.25 $I_{CHARGE}$ is equal to 0.75 $I_{DISCHARGE}$. A phase angle selection signal is applied to current sources $I_{CHARGE}$ and $I_{DISCHARGE}$ to selectively determine the magnitude of their respective currents. The dashed lines of FIG. 10B indicate a phase error.

The phase error correction circuit is initialized with the Q output of D flip flop (D-FF) 1006 low and the complementary /Q output high by a high level of ENABLE. The low level of Q turns off to switching device 1012. The high level of /Q turns on switching device 1014. These switching devices may by n-channel transistors, NPN bipolar transistors, or other suitable switching devices known in the art. Voltage $V_{ERROR}$ remains initially at zero, and no phase error correction takes place.

The low level of Q is applied to inverter 1010 to produce a high level at input D of D-FF 1006 and to enable AND gate 1000. The high level of /Q is applied to inverter 1008 to produce a low level output to disable AND gate 1002. A high level of SYNC clock at time t0 is conducted through AND gate 1000 and OR gate 1004 to the CLK input of D-FF 1006. This transfers the high level D input signal to the Q output and a corresponding low signal to the /Q output. SYNC clock then returns low to terminate the CLK signal at D-FF 1006. The high level of Q applied to switching device 1012 applies current $I_{CHARGE}$ to $C_{FILTER}$ to produce an increase in $V_{ERROR}$. The low level of /Q turns off switching device 1014. Voltage $V_{ERROR}$ is applied to the positive terminal of transconductance amplifier 1016 to produce an increase in $I_{ERROR}$ and a corresponding increase in $V_{PEAK}$. The increase in $V_{PEAK}$ increases $V_{PH-REF}$ to delay the leading edge of PHASE clock.

The high level of Q is applied to inverter 1010 to produce a low level at input D of D-FF 1006 and to disable AND gate 1000. The low level of /Q is applied to inverter 1008 to produce a high level output to enable AND gate 1002. A high level of PHASE clock at time t1 is conducted through AND gate 1002 and OR gate 1004 to the CLK input of D-FF 1006. PHASE clock then returns low to terminate the CLK signal at D-FF 1006. The low level D input signal is transferred to the Q output and a corresponding high signal to the /Q output. The low level of Q produces a high level output from inverter 1010 to enable AND gate 1000. The low level of Q also turns off switching device 1012. The high level of /Q produces a low level output from inverter 1008 to disable AND gate 1002. The high level of /Q also turns on switching device 1014 and conducts current $I_{DISCHARGE}$ from $C_{FILTER}$ to decrease $V_{ERROR}$. Voltage $V_{ERROR}$ is applied to the positive terminal of transconductance amplifier 1016 to produce a slight decrease in $I_{ERROR}$ and $V_{PEAK}$.

At time t2, a high level of SYNC clock is conducted through AND gate 1000 and OR gate 1004 to the CLK input of D-FF 1006. This transfers the high level D input signal to the Q output and a corresponding low signal to the /Q output. SYNC clock then returns low to terminate the CLK signal at D-FF 1006. The high level of Q applied to switching device 1012 applies current $I_{CHARGE}$ to $C_{FILTER}$ to produce an increase in $V_{ERROR}$. The low level of /Q turns off switching device 1014. Voltage $V_{ERROR}$ is applied to the positive terminal of transconductance amplifier 1016 to produce an increase in $I_{ERROR}$ and a corresponding increase in $V_{PEAK}$. The increase in $V_{PEAK}$ increases $V_{PH-REF}$ to delay the leading edge of PHASE clock so that it is near equilibrium.

The high level of Q is applied to inverter 1010 to produce a low level at input D of D-FF 1006 and to disable AND gate 1000. The low level of /Q is applied to inverter 1008 to produce a high level output to enable AND gate 1002. A high level of PHASE clock at time t3 is conducted through AND gate 1002 and OR gate 1004 to the CLK input of D-FF 1006. PHASE clock then returns low to terminate the CLK signal at D-FF 1006. The low level D input signal is transferred to the Q output and a corresponding high signal to the /Q output. The low level of Q produces a high level output from inverter 1010 to enable AND gate 1000. The low level of Q also turns off switching device 1012. The high level of /Q produces a low level output from inverter 1008 to disable AND gate 1002. The high level of /Q also turns on switching device 1014 and conducts current $I_{DISCHARGE}$ from $C_{FILTER}$ to decrease $V_{ERROR}$. Voltage $V_{ERROR}$ is applied to the positive terminal of transconductance amplifier 1016 to produce a slight decrease in $I_{ERROR}$ and $V_{PEAK}$.

At time t4, a high level of SYNC clock is conducted through AND gate 1000 and OR gate 1004 to the CLK input of D-FF 1006. This transfers the high level D input signal to the Q output and a corresponding low signal to the /Q output. SYNC clock then returns low to terminate the CLK signal at D-FF 1006. The high level of Q applied to switching device 1012 applies current $I_{CHARGE}$ to $C_{FILTER}$ to produce an increase in $V_{ERROR}$. The low level of /Q turns off switching device 1014. Voltage $V_{ERROR}$ is applied to the positive terminal of transconductance amplifier 1016 to produce an increase in $I_{ERROR}$ and a corresponding increase in $V_{PEAK}$. The increase in $V_{PEAK}$ increases $V_{PH-REF}$ to delay the leading edge of PHASE clock so that it achieves equilibrium.

The high level of Q is applied to inverter 1010 to produce a low level at input D of D-FF 1006 and to disable AND gate 1000. The low level of /Q is applied to inverter 1008 to produce a high level output to enable AND gate 1002. A high level of PHASE clock at time t3 is conducted through AND gate 1002 and OR gate 1004 to the CLK input of D-FF 1006. PHASE clock then returns low to terminate the CLK signal at D-FF 1006. The low level D input signal is transferred to the Q output and a corresponding high signal to the /Q output. The low level of Q produces a high level output from inverter 1010 to enable AND gate 1000. The low level of Q also turns off switching device 1012. The high level of /Q produces a low level output from inverter 1008 to disable AND gate 1002. The high level of /Q also turns on switching device 1014 and conducts current $I_{DISCHARGE}$ from $C_{FILTER}$ to decrease $V_{ERROR}$. Voltage $V_{ERROR}$ is applied to the positive terminal of transconductance amplifier 1016 to produce a slight decrease in $I_{ERROR}$ and $V_{PEAK}$. Equilibrium has been achieved, and the previous sequence continues beyond time t4 along the solid lines for $V_{ERROR}$ and $V_{PEAK}$.

Figure 11:
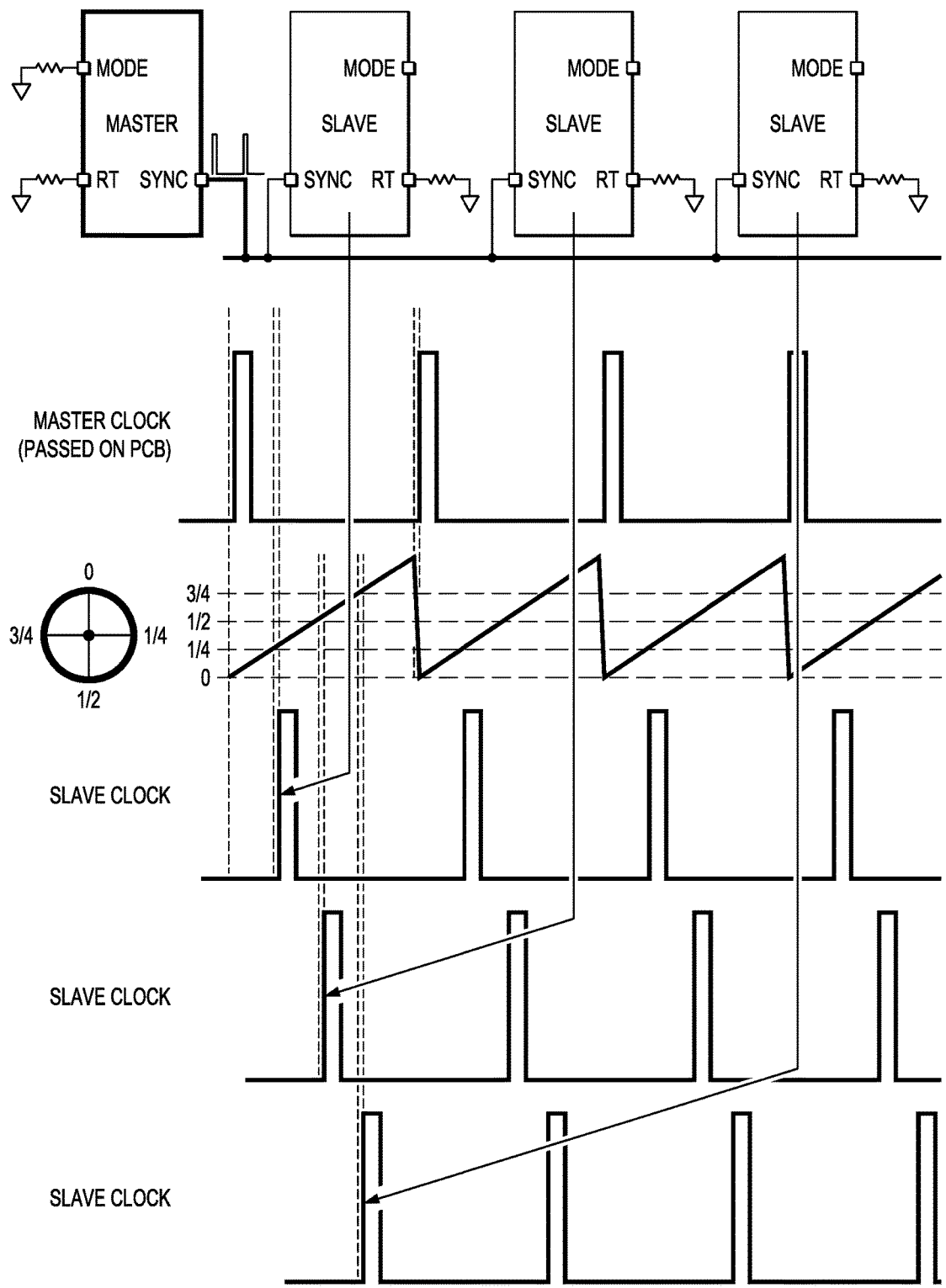
FIG. 11 is a simplified schematic diagram of an embodiment of the present invention showing operation with a four phase clock where the Master SYNC clock is passed to the Slaves.

Turning now to FIG. 11, there is a simplified schematic diagram of an embodiment of the present invention showing operation with a four phase clock where the Master SYNC clock is passed to the Slaves. Here, the Master control circuit produces the SYNC clock that is transmitted to the three Slave control circuits. A resistor is connected between the Master control circuit MODE terminal and GND to designate it as the Master. The MODE terminals of Slave control circuits are left open to designate them as Slaves. In the absence of an external synchronization clock, the Master generates SYNC clock at a frequency determined by a resistor connected between the Master RT terminal and GND. Each Slave is coupled to receive the SYNC clock from the Master and generates a respective ramp signal as previously described. The phase or synchronization point of each Slave control circuit is determined by a respective resistor connected between the RT terminal and GND.

Figure 12:
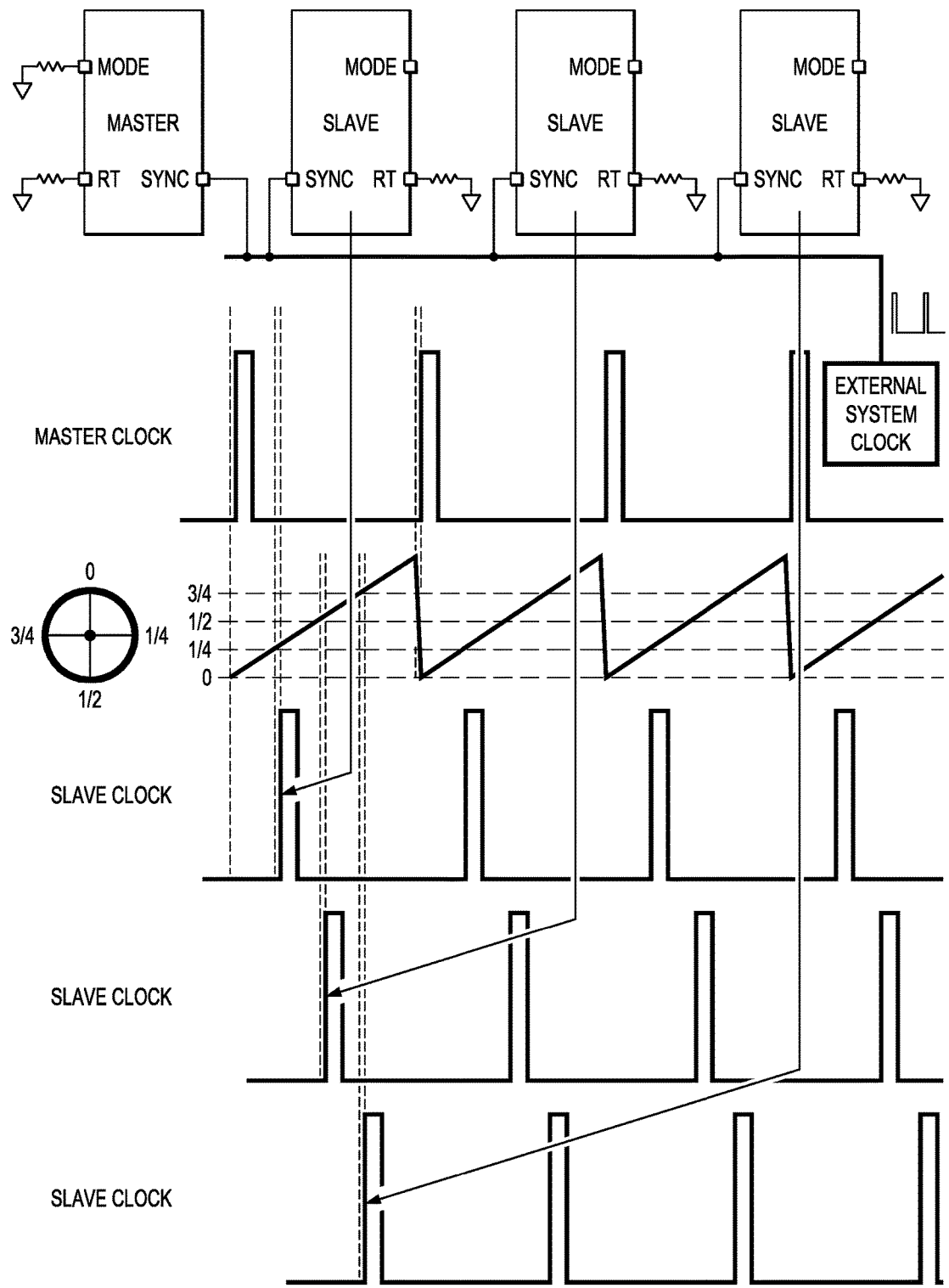
FIG. 12 is a simplified schematic diagram of an embodiment of the present invention showing operation with a four phase clock where an external SYNC clock is passed to the Master and Slaves.

FIG. 12, is a simplified schematic diagram of an embodiment of the present invention showing operation with a four phase clock where an external system clock is the SYNC clock for the Master and Slave control circuits. A resistor is connected between the Master control circuit MODE terminal and GND to designate it as the Master. The MODE terminals of Slave control circuits are left open to designate them as Slaves. The Master control circuit operates as the first of four phases in response to the external system clock. Each Slave is coupled to receive the external system clock and generates a respective ramp signal as previously described. The phase or synchronization point of each Slave control circuit is determined by a respective resistor connected between the RT terminal and GND.

Still further, while numerous examples have thus been provided, one skilled in the art should recognize that various modifications, substitutions, or alterations may be made to the described embodiments while still falling within the inventive scope as defined by the following claims. For example, programmable features of Master and Slave control circuits may be accomplished by nonvolatile memory, fuse or anti fuse programming, circuit board design or other suitable methods. Phase control methods of the present invention are not limited to multi-phase buck converters and may be advantageously utilized in other applications directed to synchronous multi-phase operation. Other combinations will be readily apparent to one of ordinary skill in the art having access to the instant specification.

The invention claimed is:

1. A phase generation circuit, comprising:
   a ramp generation circuit arranged to generate a ramp signal in synchronization with a synchronization clock signal;
   a phase selection circuit arranged to generate a reference signal in response to a phase selection signal separated from a peak voltage signal;
   a comparator having a first input terminal coupled to receive the ramp signal and a second input terminal coupled to receive the reference signal, the comparator producing a phase clock signal at an output terminal;
   a phase error correction circuit arranged to produce an error signal to correct an error in time between the synchronization clock signal and the phase clock signal;
   a sample and hold circuit arranged to sample the ramp signal; and
   a buffer circuit coupled to receive the sampled ramp signal and the error signal, the buffer circuit having an output terminal coupled to the phase error correction circuit.

2. The circuit of claim 1, wherein the phase selection circuit comprises a voltage divider circuit.

3. The circuit of claim 1, wherein the phase selection signal activates a power supply circuit.

4. The circuit of claim 1, wherein the phase selection signal activates a switching device to apply a current to a load.

5. The circuit of claim 4, comprising a sense amplifier arranged to monitor a voltage at the load.

6. A multi-phase power supply circuit, comprising:
   a Master power supply circuit arranged to produce a load current during a first phase in response to a synchronization clock signal; and
   at least one Slave power supply circuit arranged to produce a load current during at least another phase, the at least one Slave power supply circuit comprising:
   a ramp generation circuit arranged to generate a ramp signal in synchronization with the synchronization clock signal;
   a phase selection circuit arranged to generate a reference signal in response to a phase selection signal separated from a peak voltage signal;
   a comparator having a first input terminal coupled to receive the ramp signal and a second input terminal coupled to receive the reference signal, the comparator producing a phase clock signal at an output terminal;

a phase error correction circuit arranged to produce an error signal to correct an error in time between the synchronization clock signal and the phase clock signal;
a sample and hold circuit arranged to sample the ramp signal; and
a buffer circuit coupled to receive the sampled ramp signal and the error signal, the buffer circuit having an output terminal coupled to the phase error correction circuit.

7. The circuit of claim 6, wherein the phase selection circuit comprises a voltage divider circuit.

8. The circuit of claim 6, wherein the at least one Slave power supply circuit comprises:
a first Slave power supply circuit activated one third (⅓) of the synchronization clock cycle time after the Master power supply circuit is activated; and
a second Slave power supply circuit activated two thirds (⅔) of the synchronization clock cycle time after the Master power supply circuit is activated.

9. The circuit of claim 6, wherein the at least one Slave power supply circuit comprises:
a first Slave power supply circuit activated one fourth (¼) of the synchronization clock cycle time after the Master power supply circuit is activated;
a second Slave power supply circuit activated one half (½) of the synchronization clock cycle time after the Master power supply circuit is activated; and
a third Slave power supply circuit activated three fourths (¾) of the synchronization clock cycle time after the Master power supply circuit is activated.

10. A phase generation circuit, comprising:
a ramp generation circuit arranged to generate a ramp signal in synchronization with a synchronization clock signal;
a phase selection circuit arranged to generate a reference signal in response to a phase selection signal separated from a peak voltage signal; and
a comparator having a first input terminal coupled to receive the ramp signal and a second input terminal coupled to receive the reference signal, the comparator producing a phase clock signal at an output terminal,
wherein the phase selection signal activates a switching device to apply a current to a load.

11. The circuit of claim 10, comprising a phase error correction circuit arranged to produce an error signal to correct an error in time between the synchronization clock signal and the phase clock signal.

12. The circuit of claim 11, comprising:
a sample and hold circuit arranged to sample the ramp signal; and
a buffer circuit coupled to receive the sampled ramp signal and the error signal, the buffer circuit having an output terminal coupled to the phase error correction circuit.

13. The circuit of claim 10, wherein the phase selection circuit comprises a voltage divider circuit.

14. The circuit of claim 10, wherein the phase selection signal activates a power supply circuit.

15. The circuit of claim 10, comprising a sense amplifier arranged to monitor a voltage at the load.

* * * * *